US009859872B2

(12) United States Patent
Malpass

(10) Patent No.: US 9,859,872 B2
(45) Date of Patent: Jan. 2, 2018

(54) APPARATUS AND METHOD FOR TEMPERATURE MEASUREMENT AND/OR CALIBRATION VIA RESONANT PEAKS IN AN OSCILLATOR

(71) Applicant: Dialog Semiconductor GmbH, Kirchheim/Teck-Nabern (DE)

(72) Inventor: Adam Malpass, Tokyo (JP)

(73) Assignee: Dialog Semiconductor (UK) Limited, Reading (GB)

( * ) Notice: Subject to any disclaimer, the term of this patent is extended or adjusted under 35 U.S.C. 154(b) by 597 days.

(21) Appl. No.: 14/188,075

(22) Filed: Feb. 24, 2014

(65) Prior Publication Data
US 2015/0236673 A1 Aug. 20, 2015

(30) Foreign Application Priority Data

Feb. 14, 2014 (EP) .................................. 14368017

(51) Int. Cl.
H03K 3/011 (2006.01)
H03K 3/012 (2006.01)
G01K 7/32 (2006.01)
G01K 15/00 (2006.01)

(52) U.S. Cl.
CPC ............ H03K 3/011 (2013.01); G01K 7/32 (2013.01); G01K 15/005 (2013.01); H03K 3/012 (2013.01)

(58) Field of Classification Search
CPC .................................................... H03K 3/011
USPC ................................................ 331/158, 160
See application file for complete search history.

(56) References Cited

U.S. PATENT DOCUMENTS

| 4,079,280 | A | 3/1978 | Kusters et al. |
|---|---|---|---|
| 4,872,765 | A | 10/1989 | Schodowski |
| 5,231,880 | A | 8/1993 | Ward et al. |
| 5,235,844 | A | 8/1993 | Bonne et al. |
| 7,387,435 | B2 | 6/2008 | Kishi |
| 2007/0063778 | A1 | 3/2007 | Oita |
| 2008/0068107 | A1* | 3/2008 | Luich .................... H03B 5/368 331/158 |

OTHER PUBLICATIONS

European Search Report 14368017.1-1555 dated Aug. 21, 2014.
Provisional Patent DS13-042S, U.S. Appl. No. 61/811,231, "Method for providing a stabilized oscillator signal," by Adam Malpass, filed Apr. 12, 2013, 26 pgs.

* cited by examiner

Primary Examiner — Joseph Chang
(74) Attorney, Agent, or Firm — Saile Ackerman LLC; Stephen B. Ackerman

(57) ABSTRACT

An apparatus and method for a temperature and calibration utilizing resonant frequency peaks in an oscillator. A circuit providing resonant peaks for utilization for temperature measurements comprising a resonator device for providing an oscillating source, a variable gain-bandwidth amplifier in parallel with the crystal/resonator for providing modulation of the gain and/or bandwidth driving the crystal/resonator, and control of resonant peaks for selection for oscillation, a first capacitor electrically coupled to the parallel combination of the input of the variable gain-bandwidth amplifier, and the resonator device for providing charge storage for oscillation, and a second capacitor electrically coupled to parallel combination of the output of the variable gain-bandwidth amplifier, and the resonator device for providing charge storage for oscillation.

15 Claims, 3 Drawing Sheets

APPARATUS AND METHOD FOR TEMPERATURE MEASUREMENT AND/OR CALIBRATION VIA RESONANT PEAKS IN AN OSCILLATOR

RELATED PATENT APPLICATIONS

This application is related to U.S. Provisional Application 61/811,231, filed on Apr. 12, 2013, which is herein incorporated by reference in its entirety, and assigned to a common assignee.

BACKGROUND

Field

The disclosure relates generally to a resonator circuit and, more particularly, to a system with a variable gain amplifier thereof.

Description of the Related Art

It is often required to perform temperature measurements on ICs, system in packages and multi-chip modules, etc, since some components and sub-systems can have temperature dependent performance. These measurements are typically made with a temperature sensitive component or structure like a diode or band gap reference. Voltage reference circuits and oscillators are used in conjunction with semiconductor devices, integrated circuits (IC), and other applications. However, since this will be physically located at a different place on the chip (even if close) and may be made from a different material or material structure, there can exist a phase lag between the actual temperature of the component being monitored and the temperature as measured by the temperature sensor. This phase difference can be particularly problematic during periods of fast temperature transients (e.g. a step change in temperature) as it can result in large mismatches of actual and measured temperatures. If real-time temperature monitoring is required, or in situations where it is not possible to wait until temperature transients have settled (e.g. during production test) it is necessary to devise a solution where the actual temperature of a component can be measured quickly and accurately.

As discussed in U.S. Pat. No. 7,387,435 to Kishi, a temperature sensor is disclosed using a plurality of oscillator/resonator and amplifiers are utilized; a reference signal and signal are compared with a detection circuit. In a temperature sensor, especially in a temperature sensor using a resonator, based on a frequency of one oscillator circuit (resonator), frequencies of the other one or more oscillator circuits (resonators) are measured, and frequency-temperature characteristics of a plurality of resonators are synthesized in order to realize an accurate temperature sensor which does not require an accurate frequency reference regardless of a temperature change, and has a linear characteristic and a wide measurable temperature range. Also, two oscillator circuits have two resonators respectively with quadratic characteristics in which quadratic coefficients are the same and linear characteristics are different from each other, and a difference between oscillation frequencies of both oscillator circuits is obtained.

Oscillators are used to determine pressure and temperature. As discussed in U.S. Pat. No. 5,231,880 to Ward a pressure transducer is disclosed. A plurality of crystals are used to determine both pressure and temperature. A first crystal is used for pressure determination. A second crystal is used for temperature determination. A third crystal is used as a reference. Signals are compared to reference to determine pressure and temperature.

Oscillators are used for determining pressure, and one other property. As discussed in U.S. Pat. No. 5,235,844 to Bonn et al a gas property sensor is disclosed. In this embodiment, a circuit topology includes at plurality of capacitors and inductor to establish a resonant frequency.

In these prior art embodiments, the solution to establish a sensor used a plurality of crystals, or capacitor/inductor pairs utilized various alternative solutions.

SUMMARY

It is desirable to provide a solution to address the phase lag between the actual temperature of the component being monitored and the temperature as measured by the temperature sensor.

It is desirable to allow for real-time transient response temperature measurements on the semiconductor chip.

It is desirable to provide a method that addresses other physical variables.

A principal object of the present disclosure is to provide a circuit that eliminates the phase lag between the actual temperature of a component being monitored and the temperature as measured by the temperature sensor.

A principal object of the present disclosure is to provide an oscillator circuit which allows for real-time transient response temperature measurements on the semiconductor chip.

A principal object of the present disclosure is to provide an circuit that quickly and accurately measures the step-response to a change in temperature of an oscillator or other temperature sensitive component to allow for on-the-fly temperature compensation.

Another further object of the present disclosure is to provide a method to facilitate quick and accurate performing of multi-point temperature calibration within the timing limits imposed by production test.

Another further object of the present disclosure is to provide a method by which modulating the gain and/or bandwidth of the amplifier driving the resonator, it is possible to control which of these resonant peaks the circuit locks on to and oscillates.

Another further object of the present disclosure is provide an oscillator circuit that switches between two modes of operation.

Another further object of the present disclosure is to provide an oscillator that operates in an "active mode" wherein the active mode is a higher gain-bandwidth mode where the circuit locks on to the resonant peak and oscillates at a higher frequency with only a small variation of frequency with respect to temperature. This is the clock to be used as the main generated system clock.

Another further object of the present disclosure is to provide an oscillator that operates in a "temperature sensor mode" wherein the temperature sensor mode is a lower gain-bandwidth mode where the circuit locks onto a secondary resonant peak at a lower frequency, which has a much higher frequency variation with respect to temperature. This can thus be used as a temperature sensor and used to calibrate the main system clock.

Another further object of the present disclosure is to apply this methodology to other frequency measurement techniques.

Another further object of the present disclosure to apply this method to changes in supply voltage, pressure, light, or gas density.

Another further object of the present disclosure is to provide alternate circuits wherein instead of changing the gain-bandwidth of the amplifier itself, a constant wide bandwidth amplifier could be used alongside an adjustable/switchable filter.

As such, an oscillator with a variable gain amplifier with improved temperature monitoring is disclosed.

In summary, a circuit providing resonant peaks for utilization for temperature measurements comprising a resonant device for providing an oscillating source, a variable gain-bandwidth amplifier in parallel with said resonant device for providing modulation of the gain and/or bandwidth driving said resonant device, and control of resonant peaks for selection for oscillation, a first capacitor electrically coupled to the parallel combination of the input of said variable gain-bandwidth amplifier, and said resonant device for providing charge storage for oscillation, and a second capacitor electrically coupled to parallel combination of the output of said variable gain-bandwidth amplifier, and said resonant device for providing charge storage for oscillation In summary, a circuit providing resonant peaks for utilization for temperature measurements comprising an adjustable/switchable filter, a constant gain-bandwidth amplifier in parallel with said adjustable/switchable filter for providing modulation of the gain and/or bandwidth driving said resonant device, and control of resonant peaks for selection for oscillation.

In addition, a method is disclosed in accordance with the embodiment of the disclosure. A method for providing a temperature measurement and calibration utilizing resonant peaks, comprising the steps of (A) providing a circuit on a semiconductor chip, the circuit comprising a resonant device and amplifier, (B) switching the chip on at low temperature in a high gain-bandwidth mode wherein the circuit starts oscillating at a first frequency, (C) measuring a first frequency, using a reference source from a tester, (D) changing the oscillator to a low gain-bandwidth mode wherein the circuit oscillations switch to a second frequency secondary peak, wherein said second frequency is lower than said first frequency, (E) measuring the second frequency, using the reference source from the tester, (F) using an on-chip heater or external heater/cooler to change the temperature of the chip, (G) measuring a third frequency, using the reference source from the tester, (H) changing the oscillator to the high gain-bandwidth mode wherein the circuit oscillations switch back to the first frequency, (I) measuring a fourth frequency, using the reference source from the tester, (J) repeating steps (F) to (I) for as many additional temperature points as necessary, and (K) constructing a model for frequency v temperature variation for the second frequency secondary resonant peak, using globally averaged values, taking into account any frequency offset as determined by the second frequency. (L) constructing from the model constructed in step j, and the values of the first, second, third and fourth frequencies, plus additional points from step i if more than 2-point calibration is required, (M) constructing a model for frequency vs temperature variation for a fundamental resonant peak, and, (N) programming temperature compensation circuitry using the model created in step l.

A method for providing a temperature measurement and calibration utilizing resonant peaks wherein the second resonant peak is lower that the main resonant peak, comprising the steps of: (A) providing a circuit on a semiconductor chip, the circuit comprising a resonant device and amplifier, (B) switching the chip on at low temperature in a high gain-bandwidth mode wherein the circuit starts oscillating at a first frequency, (C) measuring a first frequency, using a reference source from a tester; (D) changing the oscillator to a low gain-bandwidth mode wherein the circuit oscillations switch to a second frequency secondary peak, wherein said second frequency is lower than said first frequency, (E) measuring the second frequency, using the reference source from the tester, (F) using an on-chip heater or external heater/cooler to change the temperature of the chip, (G) measuring a third frequency, using the reference source from the tester, (H) changing the oscillator to the high gain-bandwidth mode wherein the circuit oscillations switch back to the first frequency, (I) measuring a fourth frequency, using the reference source from the tester, (J) repeating steps e-h for as many additional temperature points as necessary; and (K) constructing a model for frequency v temperature variation for the second frequency secondary resonant peak, using globally averaged values, taking into account any frequency offset as determined by the second frequency.

Other advantages will be recognized by those of ordinary skill in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which.

DETAILED DESCRIPTION

Figure 1:
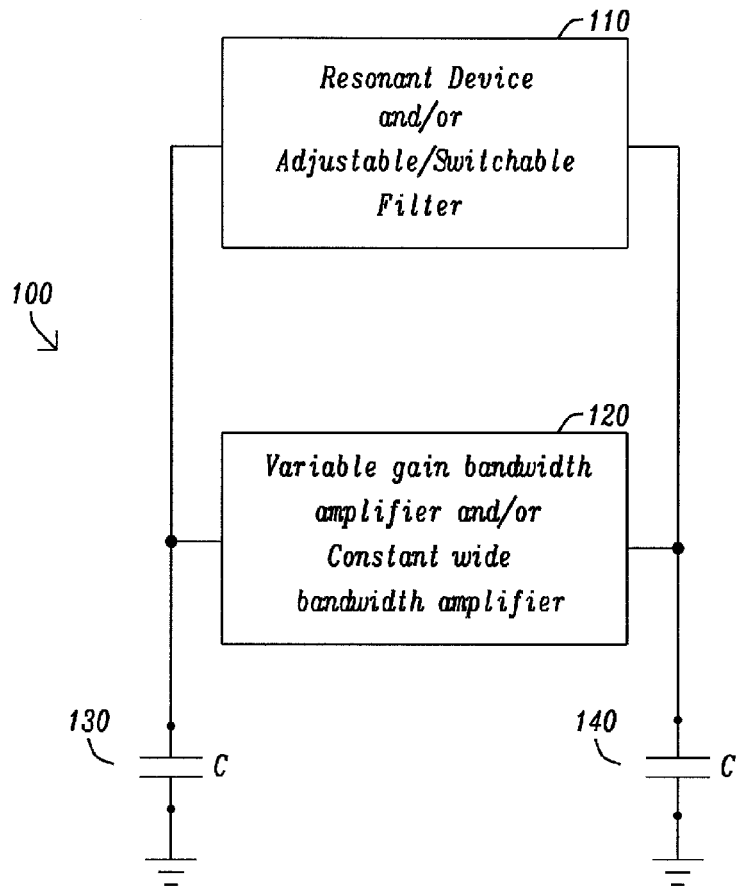
FIG. 1 is a circuit schematic of a simple oscillator with a resonant device and amplifier in accordance with a first embodiment of the disclosure.

FIG. 1 is a circuit schematic of a simple oscillator with a variable gain-bandwidth amplifier in accordance with a first embodiment of the disclosure. FIG. 1 Illustrates the circuit schematic 100 of the simple oscillator with a variable gain-bandwidth. The circuit 100 comprises of a resonant device 110. In parallel with the resonant device 110 is a variable gain-bandwidth amplifier 120. Capacitor C 130 is electrically connected to the resonant device 110 and the input of variable gain-bandwidth amplifier 120. Capacitor C 140 is electrically connected to the resonant device, and the output of the variable gain-bandwidth amplifier 120. By modulating this gain it is possible to pick out various different resonant peaks in the resonant device. The resonant device 110 can also be an adjustable switchable filter, in parallel with an amplifier, where the amplifier is a constant wide bandwidth amplifier 120. The resonant device 110 can be a discrete crystal oscillator for providing a highly stable clock signal. In addition, the resonant device can be other electronic devices, or elements for providing a stable clock, Other elements for a resonant device 110 can be a micro-electromechanical (MEMS) device.

In accordance with the embodiment in the disclosure, a resonator with one or more secondary frequency peaks in its frequency spectrum in addition to the fundamental frequency resonant peak is used. The secondary peaks can have different behaviors with respect to temperature from the fundamental frequency resonant peak. This may also be true with respect to other variables (e.g., supply voltage, pressure, light, or gas density, etc). By modulating the gain and/or bandwidth of the amplifier 120 driving the resonant device 110, it is possible to control which of these resonant peaks the circuit locks on to and oscillates at.

The oscillator circuit 100 can thus be effectively switched between two (or more) different modes, an active mode, and a temperature sensor mode. The active mode is a higher gain-bandwidth mode where the circuit locks on to the resonant peak and oscillates at a higher frequency with only a small variation of frequency with respect to temperature. This is the clock to be used as the main generated system clock. The temperature sensor mode is a lower gain-bandwidth mode where the circuit locks onto a secondary resonant peak at a lower frequency, which has a much higher frequency variation with respect to temperature. This can thus be used as a temperature sensor and used to calibrate the main system clock.

The device which requires temperature compensation (and hence requires its temperature to be measured) and the temperature sensor itself are now one and the same thing. They are made of the same material and located in exactly the same place. Therefore the temperature measured by the 'sensor' is by definition exactly identical at all times to the temperature of the device being monitored. There is no phase-lag between the two; this now allows for a multi-point temperature calibration to be performed within the tight time-constraints imposed by the production test environment.

Figure 2:
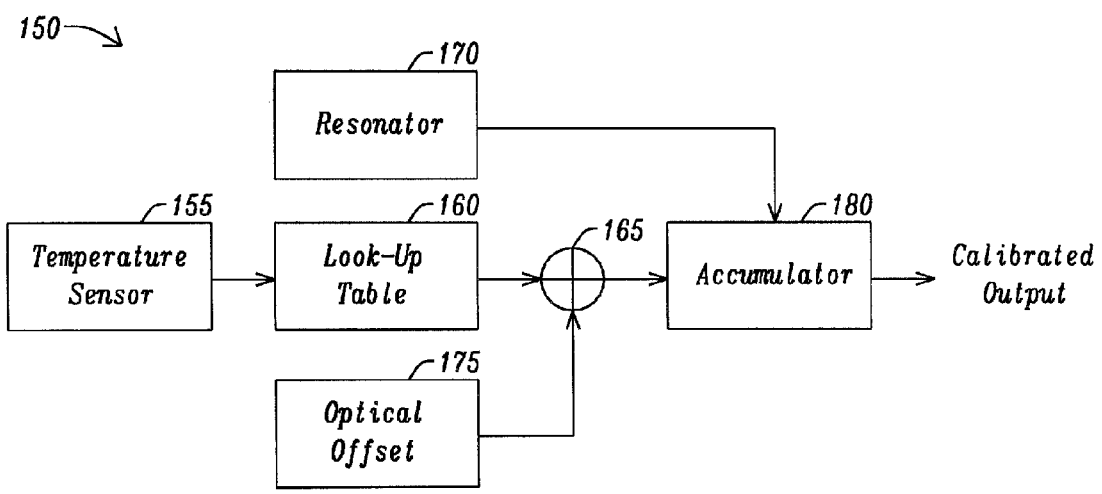
FIG. 2 is a schematic of a temperature sensor system in accordance with the first embodiment of the disclosure.

FIG. 2 is a schematic of a temperature sensor system in accordance with the first embodiment of the disclosure. FIG. 2 illustrates a temperature system 150. The temperature sensor 155 provides a signal to Look-Up table 160. The Look-Up table provides input to the adder network 165. An optional offset network 175 provides input to the adder network 165. The output of the adder 165 and Resonator 170 is provided to the Accumulator 180. The output of the Accumulator 180 provides a calibrated output signal. The temperature sensor 155 is used to index into a look-up table (LUT) 160 which adds a small or large value to the accumulator 180 depending on whether the expected frequency is too fast, or too slow. For example, if the temperature is very high and the resonator is outputting a slower frequency than required, we add a larger value to the accumulator 180, causing it to overflow more quickly and hence creating the correct output frequency and vice-versa. This method to evaluate the temperature and calibration using resonant peaks associated with the Look-Up table (LUT) 160 will be discussed below in FIG. 4.

Figure 3:
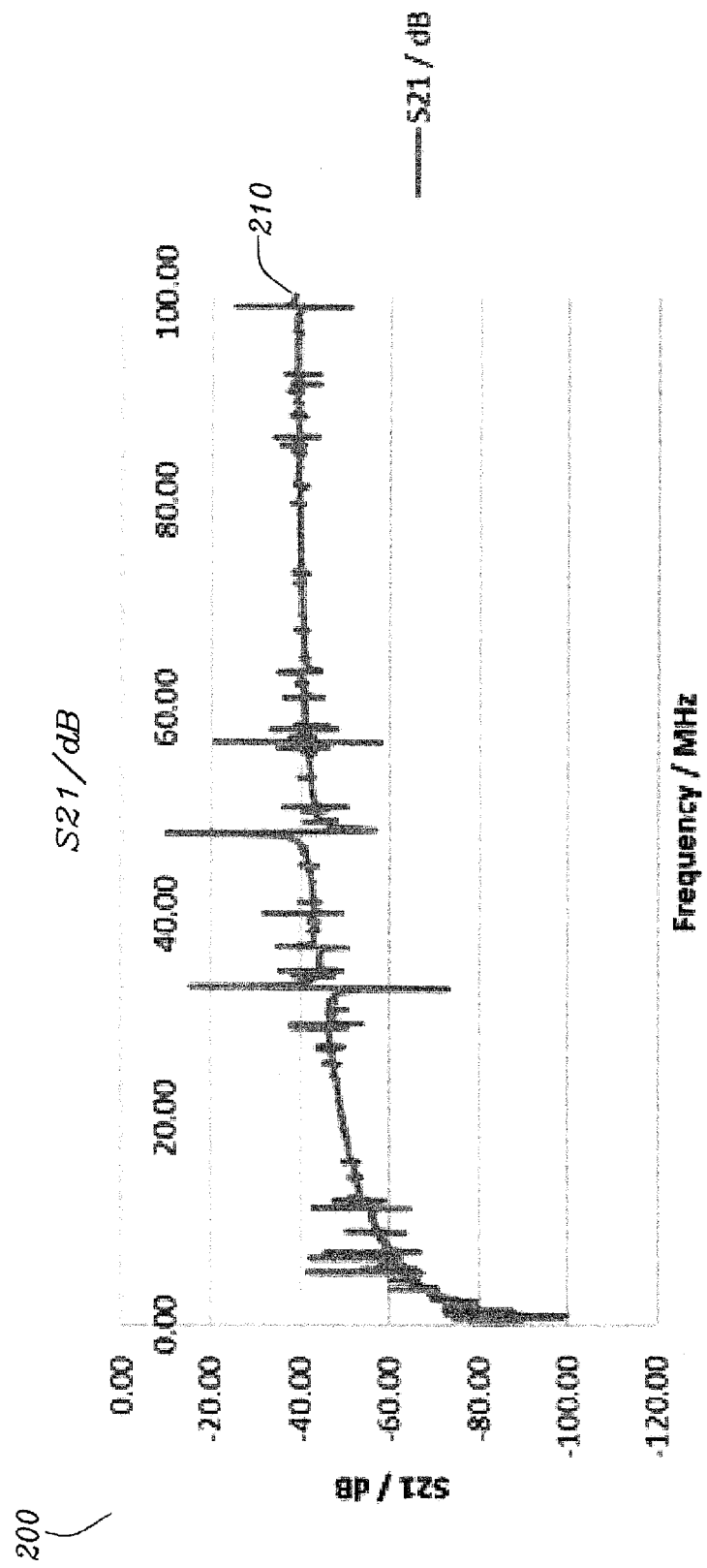
FIG. 3 is a plot of the S21 s-parameter as a function of frequency for the resonator; and, FIG. 4 is a method of temperature calibration in accordance with the embodiment of the disclosure.

FIG. 3 is a plot of the s-parameter S21 as a function of frequency for the resonator. An example of the different possible resonant peaks is shown by the S21 s-parameter of a test device. FIG. 3 with S21 parameter plot 200 contains the S21 data versus frequency 210. In the plot, resonant peaks are observable.

Figure 4:
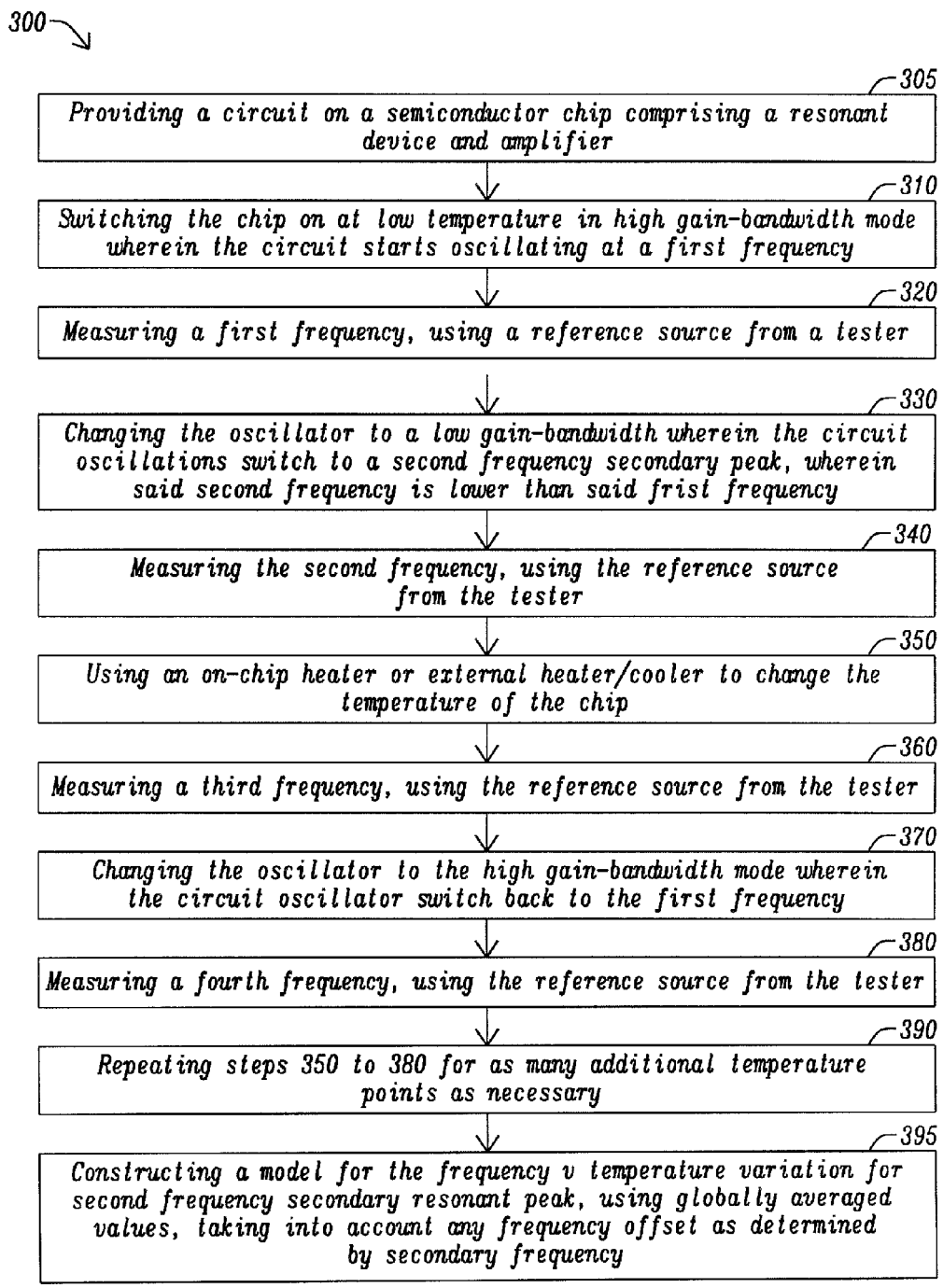

FIG. 4 is a method in accordance with the embodiment of the disclosure. A method is disclosed in accordance with the embodiment of the disclosure. A method for providing a temperature measurement and calibration utilizing resonant peaks 300, comprising the steps of a first step 305 providing a circuit on a semiconductor chip, the circuit comprising a resonant device and amplifier, a second step 310 switching the chip on at low temperature in a high gain-bandwidth mode wherein the circuit starts oscillating at a first frequency, a third step 320 measuring a first frequency, using a reference source from a tester, a fourth step 330 changing the oscillator to a low gain-bandwidth mode wherein the circuit oscillations switch to a second frequency secondary peak, wherein said second frequency is lower than said first frequency, a fifth step 340 measuring the second frequency, using the reference source from the tester, a sixth step 350 using an on-chip heater or external heater/cooler to change the temperature of the chip, a seventh step 360 measuring a third frequency, using the reference source from the tester, a eighth step 370 changing the oscillator to the high gain-bandwidth mode wherein the circuit oscillations switch back to the first frequency, a ninth step 380 measuring a fourth frequency, using the reference source from the tester, and a tenth step 390 repeating steps 350 to 380 for as many additional temperature points as necessary, an eleventh step 395 constructing a model for frequency v temperature variation for the second frequency secondary resonant peak, using globally averaged values, taking into account any frequency offset as determined by the second frequency. This method is utilized by the system in FIG. 2 where the above method is integrated into the Look-Up table.

The method of FIG. 4 can include additional steps. The method can comprise of a twelfth step constructing from the model constructed in step j, and the values of the first, second, third and fourth frequencies, plus additional points from step i if more than 2-point calibration is required, a thirteenth step constructing a model for frequency vs temperature variation for a fundamental resonant peak, and, a final fourteenth step programming temperature compensation circuitry using the model created in step k. This method is utilized by the system in FIG. 2 where the above method is integrated into the Look-Up table.

In this method, it is possible to utilize different resonant peaks. This methodology can utilize a secondary peak, higher in frequency than the fundamental frequency. This method can also utilize the tertiary peak or smaller peak to act as the temperature sensor.

In this method, a secondary, tertiary or smaller peak can be used to act as the main system clock and use the fundamental peak as the temperature sensor. In this methodology, the resonant peak can be lower than the main resonant peak. Additionally, the higher gain-bandwidth can be the main generated clock, and the lower gain-bandwidth can be the temperature sensor. In this method, a MEMS device could be constructed which had a main resonant peak at a lower frequency, and another resonant peak with well-defined response with respect to temperature at a higher frequency. In this case you would need to use a lower gain bandwidth when main generated clock is wanted, and a higher gain bandwidth when the temperature sensor is required.

In addition, the sequence of the method can be used for different initial conditions of lower temperature or higher temperature. The semiconductor chip could start initially at high temperature and then be cooled rather than low temperature then heated.

The methodology in this disclosure, can be applied to other frequency measurement techniques to evaluate changes in other physical parameters. For example, the methodology in this disclosure could measure supply voltage, pressure, light, or gas density.

Other equivalent circuit embodiments are also can be utilized. Rather than changing the gain-bandwidth of the amplifier itself, a constant wide bandwidth amplifier could be used alongside an adjustable/switchable filter can be used instead of changing the gain-bandwidth of the amplifier itself.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Furthermore, it should be noted that steps of various above-described methods and components of described systems can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

In addition, it should be noted that the functions of the various elements described in the present disclosure may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The disclosed circuits and devices may in particular be integrated on a single semiconductor chip using various technologies.

Other advantages will be recognized by those of ordinary skill in the art. The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. A circuit providing resonant peaks for utilization for temperature measurements wherein a plurality of said resonant peaks are utilized comprising
a resonant device consisting of an oscillator for providing an oscillating source;
a variable gain-bandwidth amplifier and/or constant bandwidth amplifier in parallel with said resonant device for providing modulation of the gain and/or bandwidth driving said resonant device, and control of resonant peaks for selection for oscillation;
a first capacitor electrically coupled to the parallel combination of the input of said variable gain-bandwidth amplifier and/or constant bandwidth amplifier, and said resonant device for providing charge storage for oscillation; and,
a second capacitor electrically coupled to parallel combination of the output of said variable gain-bandwidth amplifier and/or said constant bandwidth amplifier, and said resonant device for providing charge storage for oscillation.

2. The circuit of claim 1 wherein said circuit functions in at least one mode of operation.

3. The circuit of claim 2 wherein said circuit operates in an active mode of operation, wherein said active mode is a higher gain-bandwidth mode where the said circuit locks on to the resonant peak and oscillates at a higher frequency with only a small variation of frequency with respect to temperature.

4. The circuit of claim 3 wherein said circuit is the clock to be used as the main generated system clock.

5. The circuit of claim 2 wherein said circuit operates in a temperature sensor mode of operation wherein the temperature sensor mode is a lower gain-bandwidth mode wherein said circuit locks onto a secondary resonant peak at a lower frequency, which has a much higher frequency variation with respect to temperature.

6. The circuit of claim 5 wherein said circuit is utilized as a temperature a temperature sensor and used to calibrate the main system clock.

7. The circuit of claim 1 wherein said resonant peaks for selection of operation is the fundamental resonant peak.

8. The circuit of claim 1 wherein said resonant peaks for selection of operation is the second resonant peak.

9. The circuit of claim 1 wherein said resonant peaks for selection is the tertiary resonant peak.

10. The circuit of claim 1 wherein said resonant peaks for selection is any higher order resonant peak.

11. The circuit of claim 5 wherein said circuit eliminates the phase lag between the actual temperature of a component being monitored and the temperature as measured by the temperature sensor.

12. The circuit of claim 5 wherein said circuit allows for real-time transient response temperature measurements on the semiconductor chip.

13. The circuit of claim 5 wherein said circuit accurately measures the step-response to a change in temperature of an oscillator or other temperature sensitive component to allow for on-the-fly temperature compensation.

14. The circuit of claim 5 wherein said circuit is responsive allows for quick and accurate performance of a multi-point temperature calibration within the timing limits imposed by production test.

15. A circuit providing resonant peaks for utilization for temperature measurements comprising
an adjustable/switchable filter;
a constant gain-bandwidth amplifier in parallel configuration with said adjustable/switchable filter for providing modulation of the gain and/or bandwidth driving resonator device, and control of resonant peaks for selection for oscillation;
a first capacitor electrically coupled to the parallel combination of the input of said variable gain-bandwidth amplifier, and/or constant bandwidth amplifier, and electrically coupled to ground potential and said resonant device for providing charge storage for oscillation; and,
a second capacitor electrically coupled to parallel combination of the output of said variable gain-bandwidth amplifier, and/or constant bandwidth amplifier, and electrically coupled to ground potential and said resonant device for providing charge storage for oscillation.

* * * * *